United States Patent
Chen et al.

(10) Patent No.: US 12,336,186 B2
(45) Date of Patent: Jun. 17, 2025

(54) SEMICONDUCTOR DEVICES HAVING FERROELECTRIC TUNNEL JUNCTION STRUCTURE

(71) Applicant: Taiwan Semiconductor Manufacturing Company, Ltd., Hsinchu (TW)

(72) Inventors: Ying-Chih Chen, Hsinchu County (TW); Blanka Magyari-Kope, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 366 days.

(21) Appl. No.: 17/835,988

(22) Filed: Jun. 9, 2022

(65) Prior Publication Data

US 2023/0403863 A1    Dec. 14, 2023

(51) Int. Cl.
*H10B 53/30* (2023.01)
*H10B 51/30* (2023.01)
*H10D 30/69* (2025.01)

(52) U.S. Cl.
CPC ............. *H10B 53/30* (2023.02); *H10B 51/30* (2023.02); *H10D 30/701* (2025.01)

(58) Field of Classification Search
CPC ... H01L 29/78391; H10B 51/10; H10B 51/20; H10B 51/30; H10B 53/10; H10B 53/20; H10B 53/30; H10D 30/701
See application file for complete search history.

(56) References Cited

U.S. PATENT DOCUMENTS

| | | | |
|---|---|---|---|
| 2018/0331113 A1* | 11/2018 | Liao | H10B 53/30 |
| 2020/0321474 A1* | 10/2020 | Ramamoorthy | H01L 29/78618 |
| 2021/0272983 A1* | 9/2021 | Gilbert | H01L 29/78391 |
| 2022/0231036 A1* | 7/2022 | Lee | H01L 29/6684 |
| 2022/0343962 A1* | 10/2022 | Trantham | G11C 11/2297 |
| 2023/0292526 A1* | 9/2023 | Hsieh | H01L 28/75 |
| 2023/0377877 A1* | 11/2023 | Leonhardt | C23C 16/45531 |

FOREIGN PATENT DOCUMENTS

| | | | | |
|---|---|---|---|---|
| CN | 114999895 A | * | 9/2022 | |
| DE | 102021119950 A1 | * | 9/2022 | H01L 27/11507 |
| WO | WO-2023065195 A1 | * | 4/2023 | |

OTHER PUBLICATIONS

Robin Materlik et al., "The impact of charge compensated and uncompensated strontium defects on the stabilization of the ferroelectric phase in HfO2", Applied Physics Letters 111, 082902 (2017), Aug. 22, 2017, pp. 1-6.

(Continued)

*Primary Examiner* — Matthew E Warren
(74) *Attorney, Agent, or Firm* — JCIPRNET

(57) ABSTRACT

A semiconductor device includes a first electrode layer, a ferroelectric layer, and a second electrode layer. A material of the ferroelectric layer comprises a ferroelectric material doped with a first dopant and a second dopant different from the first dopant, and the first dopant comprises cerium. The ferroelectric layer is disposed between the first electrode layer and the second electrode layer.

20 Claims, 6 Drawing Sheets

(56) References Cited

OTHER PUBLICATIONS

Rohit Batra et al., "Dopants Promoting Ferroelectricity in Hafnia: Insights From A Comprehensive Chemical Space Exploration", Chem. Mater. 2017, 29, 21, 9102-9109, Oct. 13, 2017, pp. 1-25.

Max Falkowski et al., "Unexpectedly large energy variations from dopant interactions in ferroelectric HfO2 from high-throughput ab initio calculations", npj Computational Materials vol. 4, Article No. 73 (2018), Dec. 10, 2018, pp. 1-9.

Robin Materlik et al., "Ai-, Y-, and La-doping effects favoring intrinsic and field induced ferroelectricity in HfO2: A first principles study", Journal of Applied Physics 123, 164101 (2018), Apr. 24, 2018, pp. 1-12.

Christopher Künneth et al., "Impact of Four-Valent Doping on the Crystallographic Phase Formation for Ferroelectric HfO from First-Principles: Implications for Ferroelectric Memory and Energy-Related Applications", ACS Applied Nano Materials 2018, 1, 1, 254-264, Dec. 8, 2017, pp. 1-35.

Shuaizhi Zheng et al., "Improvement of remanent polarization of CeO2—HfO2 solid solution thin films on Si substrates by chemical solution deposition", Applied Physics Letters 117, 212904 (2020), Nov. 24, 2020, pp. 1-7.

\* cited by examiner

SEMICONDUCTOR DEVICES HAVING FERROELECTRIC TUNNEL JUNCTION STRUCTURE

BACKGROUND

The integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
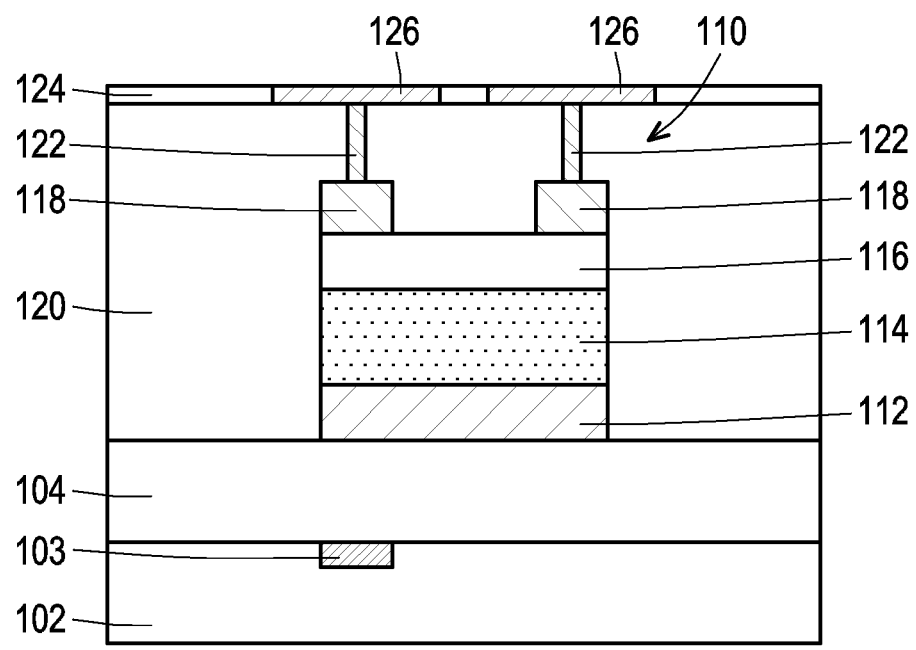
FIG. 1 illustrates a cross-sectional view of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a semiconductor device in accordance with some embodiments of the disclosure.

Referring to FIG. 1, a semiconductor device 100 includes a transistor 110. In some embodiments, the transistor 110 is a FeFET. As shown in FIG. 1, the transistor 110 is disposed on a dielectric layer 104 over a substrate 102, and includes an electrode layer 112, a ferroelectric layer 114, a channel region 116 and source and drain regions 118.

In some embodiments, the substrate 102 includes a semiconductor substrate. In some embodiments, the substrate 102 includes a crystalline silicon substrate or a doped semiconductor substrate (e.g., p-type semiconductor substrate or n-type semiconductor substrate). In some alternative embodiments, the substrate 102 includes a semiconductor substrate made of other suitable elemental semiconductor, such as diamond or germanium; a suitable compound semiconductor, such as silicon carbide, gallium arsenic, gallium phosphide, gallium nitride, indium phosphide, indium arsenide, or indium antimonide; or a suitable alloy semiconductor, such as SiGe, GaAsP, AlInAs, AlGaAs, GaInAs, GaInP, or GaInAsP. Other substrates, such as multi-layered or gradient substrates, may also be used. A device 103, such as a transistor (e.g., front-end-of-line transistor), a diode, a capacitor, a resistor, etc., may be formed in and/or on the substrate 102 and may be interconnected by interconnect structures formed by, for example, metallization patterns in one or more dielectric layers over the substrate 102.

The dielectric layer 104, which may be an interlayer dielectric (ILD) layer, is formed over the substrate 102. The dielectric layer 104 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), Lanthanum strontium manganite (LSMO) or the like; or a combination thereof, and may be formed, for example, by spin coating, lamination, chemical vapor deposition (CVD), or the like. In some embodiments, a contact (not shown) is formed in the dielectric layer 104 to electrically couple to the device 103. The contact may be formed by forming an opening in the dielectric layer 104 and filling the opening with an electrically conductive material (e.g., copper, tungsten, or the like).

In some embodiments, the electrode layer 112 in the transistor 110 is also referred to as a back gate. As shown in FIG. 1, the electrode layer 112 is disposed on the dielectric layer 104. In some embodiments, the electrode layer 112 is formed by deposition and/or photolithography and etching process. In some embodiments, a metallic material is deposited through atomic layer deposition (ALD), CVD, physical vapor deposition (PVD), or the like. Thereafter, a patterned photoresist layer (not shown) is formed on the metallic material to define the shape of the subsequently formed electrode layer 112. Subsequently, an etching process is performed to remove the metallic material that is not covered by the patterned photoresist layer. The etching process includes, for example, an anisotropic etching process such as dry etch or an isotropic etching process such as wet etch. Then, the patterned photoresist layer is removed through a stripping process or the like to expose the remaining metallic material, which constitutes the electrode layer 112. In some alternative embodiments, the electrode layer 112 may be formed by a single damascene process. For example, a trench is first formed in a dielectric layer, followed by filling the trench with a metallic material. A planarization process such as a CMP process is then performed to remove the excess portions of the metallic material higher than the top surface of the dielectric layer, leaving the electrode layer 112 in the trench.

In some embodiments, the metallic material of the electrode layer 112 includes copper, titanium, tantalum, tungsten, aluminum, zirconium, hafnium, cobalt, ruthenium, molybdenum, titanium aluminum, tantalum aluminum, titanium nitride, tantalum nitride, tungsten aluminum, zirconium aluminum, hafnium aluminum, tungsten carbon nitride, any other suitable metal-containing material, or a combination thereof. In some embodiments, the electrode layer 112 also includes materials to fine-tune the corresponding work function. For example, the metallic material of the electrode layer 112 may include p-type work function materials such as Ru, Mo, WN, $ZrSi_2$, $MoSi_2$, $TaSi_2$, $NiSi_2$, or combinations thereof, n-type work function materials such as Ag, TaCN, Mn, or combinations thereof, or conducting oxide materials such as indium tin oxide (ITO). In some embodiments, the thickness of the electrode layer 112 ranges from about 20 nm to about 1000 nm.

In some embodiments, the ferroelectric layer 114 is disposed on the electrode layer 112. As shown in FIG. 1, the ferroelectric layer 114 is in direct contact with the electrode layer 112. In some embodiments, the ferroelectric layer 114 has a thickness ranging from about 10 Å to about 400 Å. In some embodiments, the material of the ferroelectric layer 114 includes a ferroelectric material doped with a first dopant and a second dopant. That is to say, the ferroelectric layer 114 is formed of a co-doping ferroelectric material. In some embodiments, the foregoing material of ferroelectric layer 114 may be deposited by suitable fabrication techniques such as ALD, PVD, plasma-enhanced CVD (PECVD), plasma-enhanced atomic layer deposition (PEALD), or combinations thereof. For example, the ferroelectric layer 114 is formed by a low-temperature ALD process at a temperature ranging from about 200° C. to about 600° C., which may be integrated into back end of line (BEOL).

In some embodiments, the ferroelectric material includes hafnium zirconium oxide (HfZrO), or hafnium oxide ($HfO_2$). In some embodiments, the content of Zr in hafnium zirconium oxide (HfZrO) is in a range of about 30% to about 70%. In some embodiments, the type of the first dopant is chosen for keeping high ferroelectric stability of the ferroelectric material. For example, the first dopant is cerium (Ce). In some embodiments, after doping, the content of Ce in the ferroelectric material is in a range of greater than 0% to about 20%. Doping the said ferroelectric material with greater than 0% to about 20% of Ce, the remanent polarization (2 Pr) value is enhanced by about 50% to about 200%. In some other embodiments, after doping, the content of Ce in the ferroelectric material is in a range of about 4% to about 10%. Doping the said ferroelectric material with about 4% to about 10% of Ce, the remanent polarization (2 Pr) value is enhanced by about 50% to about 200%. In some embodiments, the type of the second dopant is chosen for lowering ferroelectric coercive field of the ferroelectric material (i.e., thermodynamically stabilizing the metal-stable phase). For example, the second dopant is at least one element selected from a group consisting of Group II, Group III, Group IV and lanthanide. In some embodiments, the second dopant includes strontium (Sr), barium (Ba), yttrium (Y), lanthanum (La), gadolinium (Gd), aluminum (Al), silicon (Si), germanium (Ge), or a combination thereof. In some embodiments, after doping, the content of the second dopant in the ferroelectric material is in a range of greater than 0% to about 12%. Doping the said ferroelectric material with greater than 0% to about 12% of the second dopant, the ferroelectric coercive field is reduced by about 10% to larger than 99%. In some other embodiments, after doping, the content of the second dopant in the ferroelectric material is in a range of about 3% to about 6%. Doping the said ferroelectric material with about 3% to about 6% of the second dopant, the ferroelectric coercive field is reduced by about 20% to about 80%. For example, after doping about 6.25% of Ce and about 3.13% of Si into the ferroelectric material, the ferroelectric coercive field is potentially reduced from 1-2 MV/cm to 0.32-0.64 MV/cm.

As such, it is noted that by using proper co-doping in ferroelectric material of the ferroelectric layer 114 (i.e., doping the first dopant and the second dopant), the reduced ferroelectric coercive field and the enhanced polarization are achieved. That is to say, ferroelectric properties of the ferroelectric layer 114 are improved by the co-doping approach. In other words, the co-doping approach of the ferroelectric layer 114 not only effectively lowers the switching barrier between different polarization states (i.e., lowers the switching electric field) and thus lower the operational erase and program voltage in the transistor 110, but also enhances the ferroelectric stability without polarization reduction. Further, the lowered operational voltage of the transistor 110 can strongly reduce defect generation rate in the ferroelectric layer 114. The accumulation of defects causes ferroelectric dead layer, domain pinning and film break-down, and reduces product reliability. Therefore, by using proper co-doping in ferroelectric material of the ferroelectric layer 114, a low-power consumption and long life time of the transistor 110 can be achieved without performance loss, and the fatigue and the breakdown may be suppressed. In some embodiments, the operational voltage of the transistor 110 which includes the ferroelectric layer 114 having the co-doping ferroelectric material (hereinafter "the co-doped device") can be at most 70% lower compared to the non-doped or improper-doped device. In some embodiments, the life time enhancement of the co-doped device due to the low voltage operation is at least about 1000 times, compared to the non-doped device.

From another point of view, by co-doping the first dopant and the second dopant into ferroelectric material of the ferroelectric layer 114, the preferred crystalline phase of the ferroelectric layer 114 is achieved. For example, the increased orthorhombic phase (O-phase) of the ferroelectric layer 114 may result in a higher ferroelectric polarization. And, for example, the tetragonal phase (T-phase) of the ferroelectric layer 114 may be stabilized to result in a reduced ferroelectric coercive field.

In some embodiments, the channel region 116 is a channel layer disposed on the ferroelectric layer 114. The channel region 116 may have a thickness ranging from about 20 Å to about 100 Å. In some embodiments, the channel region 116 includes oxide semiconductor material such as ZnO, InO, SnO, $Ga_2O_3$, MgO, GdO, ITO, InZnO (IZO), InGaZnO (IGZO), InWO, InBO (IBO) the like, or a combination thereof. In some embodiments, the channel region 116 includes Group IV material such as Si, Ge and their alloy, and may be doped with Group III or V element to enhance mobility. In some embodiments, the channel region 116 is made of a single layer having one of the foregoing materials. However, the disclosure is not limited thereto. In some alternative embodiments, the channel region 116 may be made of a laminate structure of at least two of the foregoing materials. In some embodiments, the channel region 116 is deposited by suitable techniques, such as CVD, ALD, PEALD, PVD, PECVD, epitaxial growth, or the like.

In some embodiments, the source and drain regions 118 are disposed at opposite sides of the electrode layer 112 on the channel region 116. In some embodiments, the material of the source and drain regions 118 includes cobalt, tungsten, copper, titanium, tantalum, aluminum, zirconium, hafnium, a combination thereof, or other suitable metallic materials. In some embodiments, the material of the source and drain regions 118 includes conducting oxide material (such as ITO) or metal nitride material (such as TaN, TiN, WN, HfN). In some embodiments, the source and drain regions 118 are formed through CVD, ALD, plating, or other suitable deposition techniques.

In some embodiments, a dielectric layer 120 is formed over the transistor 110. The material of the dielectric layer 120 includes $SiO_2$, SiN, a low-K dielectric material, or the like. The dielectric layer 120 may be formed by CVD, PVD, or the like. In some embodiments, source and drain contacts 122 are formed to extend from the upper surface of the dielectric layer 120 into the dielectric layer 120, and to electrically couple to the source and drain regions 118. In some embodiments, the material of the source and drain contacts 122 is the same as the material of the source and drain regions 118. However, the disclosure is not limited thereto. In some alternative embodiments, the material of the source and drain contacts 122 may be different from the material of the source and drain regions 118. In some embodiments, the material of the source and drain contacts 122 includes cobalt, tungsten, copper, titanium, tantalum, aluminum, zirconium, hafnium, a combination thereof, or other suitable metallic materials. In order to reduce resistivity, 2D and 1D material (e.g., graphene nanosheet or carbon nanotube) can be used for the source and drain contacts 122.

Next, a dielectric layer 124 is formed over the dielectric layer 120, and conductive lines 126 are formed in the dielectric layer 124. In some embodiments, the conductive lines 126 are electrically coupled to the source and drain contacts 122, respectively. The dielectric layer 124 may include the same or similar material as the dielectric layer 120, and may be formed using the same or similar formation method, and thus details are not repeated. The conductive lines 126 may be formed using any suitable method, such as a damascene process. For example, trenches are first formed in the dielectric layer 124, followed by filling the trenches with a metallic material. A planarization process such as a CMP process is then performed to remove the excess portions of the metallic material higher than the top surface of the dielectric layer 124, leaving the conductive lines 126 in the trenches. In some alternative embodiments, the conductive lines 126 and the source and drain contacts 122 are formed together in a dual-damascene process, in such case the dielectric layers 120, 124 may be formed together as one layer. For example, trenches connecting with openings are formed in the dielectric layer, followed by filling the trenches and the openings with a metallic material. A planarization process such as a CMP process is then performed to remove the excess portions of the metallic material higher than the top surface of the dielectric layer, leaving the conductive lines 126 in the trenches and the source and drain contacts 122 in the openings. The metallic material may include aluminum, titanium, copper, nickel, tungsten, or alloys thereof. In some embodiments, the dielectric layers 104, 120, 124 and the conductive lines 126 are portions of an interconnect structure on the substrate 102, and the transistor 110 is embedded in the interconnect structure. The transistor 110 may be a back end of line (BEOL) transistor. In some embodiments, a passivation layer (not shown), a post-passivation layer (not shown), a plurality of conductive pads (not shown) in the passivation layer, and a plurality of conductive terminals (not shown) in the post-passivation layer are disposed on the interconnect structure. It should be noted that one or more connection tiers may be interposed between the transistor 110 and the conductive line 126, with conductive patterns of the connection tiers establishing electrical connection between the transistor 110 and the conductive line 126. In addition, although the conductive lines 126 are illustrated as at the same level, they may at different height.

Figure 2:
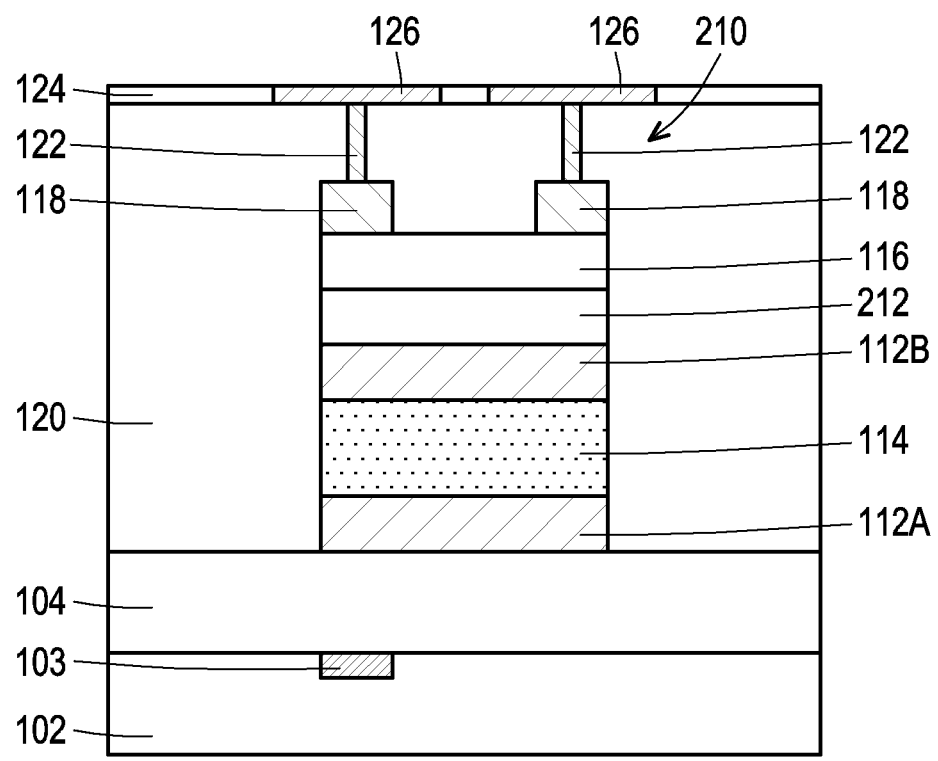
FIG. 2 is a cross-sectional view of a semiconductor device in accordance with some alternative embodiments of the disclosure.

FIG. 2 is a cross-sectional view of a semiconductor device in accordance with some alternative embodiments of the disclosure. Referring to FIG. 2, a semiconductor device 200 in FIG. 2 is similar to the semiconductor device 100 in FIG. 1, so similar elements are denoted by the same reference numeral and the detailed description thereof is omitted herein.

Referring to FIG. 2, the semiconductor device 200 includes a transistor 210. In some embodiments, the transistor 210 is a FeFET. As shown in FIG. 2, the transistor 210 is disposed on a dielectric layer 104 over a substrate 102, and includes electrode layers 112A, 112B, a ferroelectric layer 114, a dielectric layer 212, a channel region 116 and source and drain regions 118.

In some embodiments, the electrode layer 112A, the ferroelectric layer 114, and the electrode layer 112B are sequentially formed on the dielectric layer 104. The ferroelectric layer 114 is disposed between the electrode layers 112A, 112B. The electrode layers 112A, 112B may include the same or similar material as the electrode layer 112 in FIG. 1, and may be formed using the same or similar formation method, thus details are not repeated.

In some embodiments, the dielectric layer 212 is formed on the electrode layer 112B. In some embodiments, the dielectric layer 212 includes a high-k material having a dielectric constant greater than about 3.9, greater than about 10 or even greater than about 20, such as zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, titanium oxide, a hafnium dioxide-alumina ($HfO_2$—$Al_2O_3$) alloy, the like, or a combination thereof. The foregoing materials may be deposited by suitable fabrication techniques such as ALD, CVD, metalorganic CVD (MOCVD), PVD, thermal oxidation, UV-ozone oxidation, remote plasma atomic layer deposition (RPALD), PEALD, molecular beam deposition (MBD), or combinations thereof. In some embodiments, the dielectric layer 212 is a single layer, as shown in FIG. 2. However, the disclosure is not limited thereto. In some alternative embodiments, the dielectric layer 212 has a multi-layer structure.

In some embodiments, the channel region 116 is formed on the dielectric layer 212, and the source and drain regions 118 are formed at opposite sides of the electrode layer 112A, 112B on the channel region 118.

As mentioned above, it is noted that by using proper co-doping in ferroelectric material of the ferroelectric layer 114 (i.e., doping the first dopant and the second dopant), the reduced ferroelectric coercive field and the enhanced polarization are achieved. Thus, the transistor 210 (i.e., FeFET) can have a high reliability performance.

Figure 3:
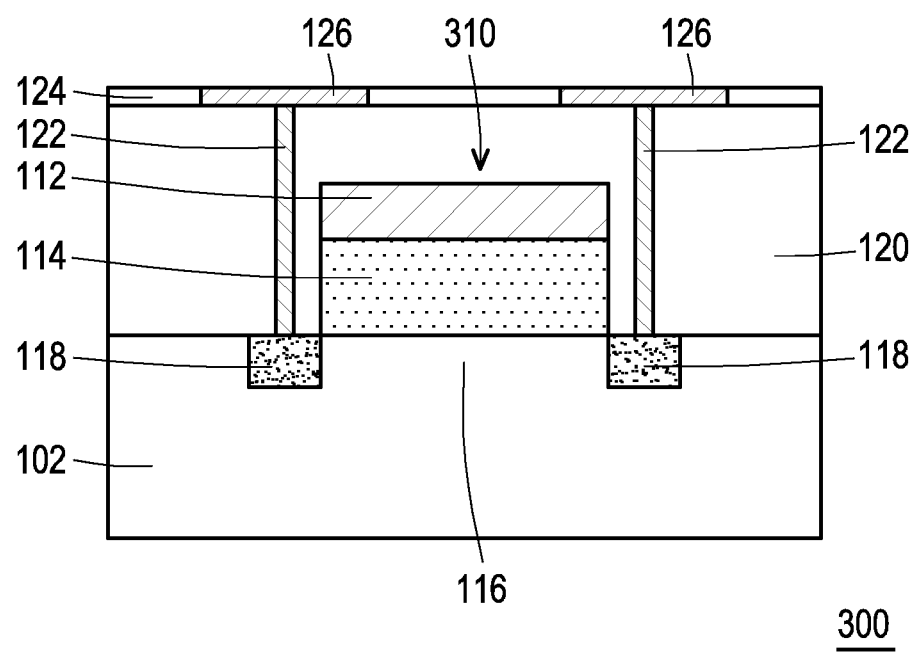
FIG. 3 is a cross-sectional view of a semiconductor device in accordance with some alternative embodiments of the disclosure.

FIG. 3 is a cross-sectional view of a semiconductor device in accordance with some alternative embodiments of the disclosure. Referring to FIG. 3, a semiconductor device 300 in FIG. 3 is similar to the semiconductor device 100 in FIG. 1, so similar elements are denoted by the same reference numeral and the detailed description thereof is omitted herein.

Referring to FIG. 3, the semiconductor device 300 is disposed in and on a substrate 102. In some embodiments, the semiconductor device 300 includes a transistor 310 such as a FeFET. As shown in FIG. 3, the transistor 310 includes an electrode layer 112, a ferroelectric layer 114, a channel region 116 and source and drain regions 118.

In some embodiments, the source and drain regions 118 are doped regions in the substrate 102. The source and drain regions 118 are doped with the same conductive type dopants. For example, the source and drain regions 118 are doped with n-type dopants such as phosphorus or arsenic and configured for an n-type field-effect transistor, or alternatively, the source and drain regions 118 are doped with p-type dopants such as boron or BF 2 and configured for a p-type field-effect transistor. In some embodiments, the channel region 116 is formed in the substrate 102 between the source and drain regions 118. In some alternative embodiments, the channel region 116 is doped with a dopant to achieve extra stability. For example, the channel region 116 may be doped with silicon dopant or the like. In some embodiments, conductive lines 126 in a dielectric layer 124 may be electrically couple to the source and drain regions 118 through source and drain contacts 122 in a dielectric layer 120. However, the disclosure is not limited thereto.

In some embodiments, the ferroelectric layer 114 is disposed on the channel region 116, and the electrode layer 112 is disposed on the ferroelectric layer 114. In some embodiments, the electrode layer 112 is in direct contact with the ferroelectric layer 114, and the ferroelectric layer 114 is in direct contact with the channel region 116. In other words, the ferroelectric layer 114 is sandwiched between the channel region 116 and the electrode layer 112, and opposite surfaces of the ferroelectric layer 114 are both in direct contact with the channel region 116 and the electrode layer 112.

As mentioned above, it is noted that by using proper co-doping in ferroelectric material of the ferroelectric layer 114 (i.e., doping the first dopant and the second dopant), the reduced ferroelectric coercive field and the enhanced polarization are achieved. Thus, the transistor 310 (i.e., FeFET) can have a high reliability performance.

Figure 4:
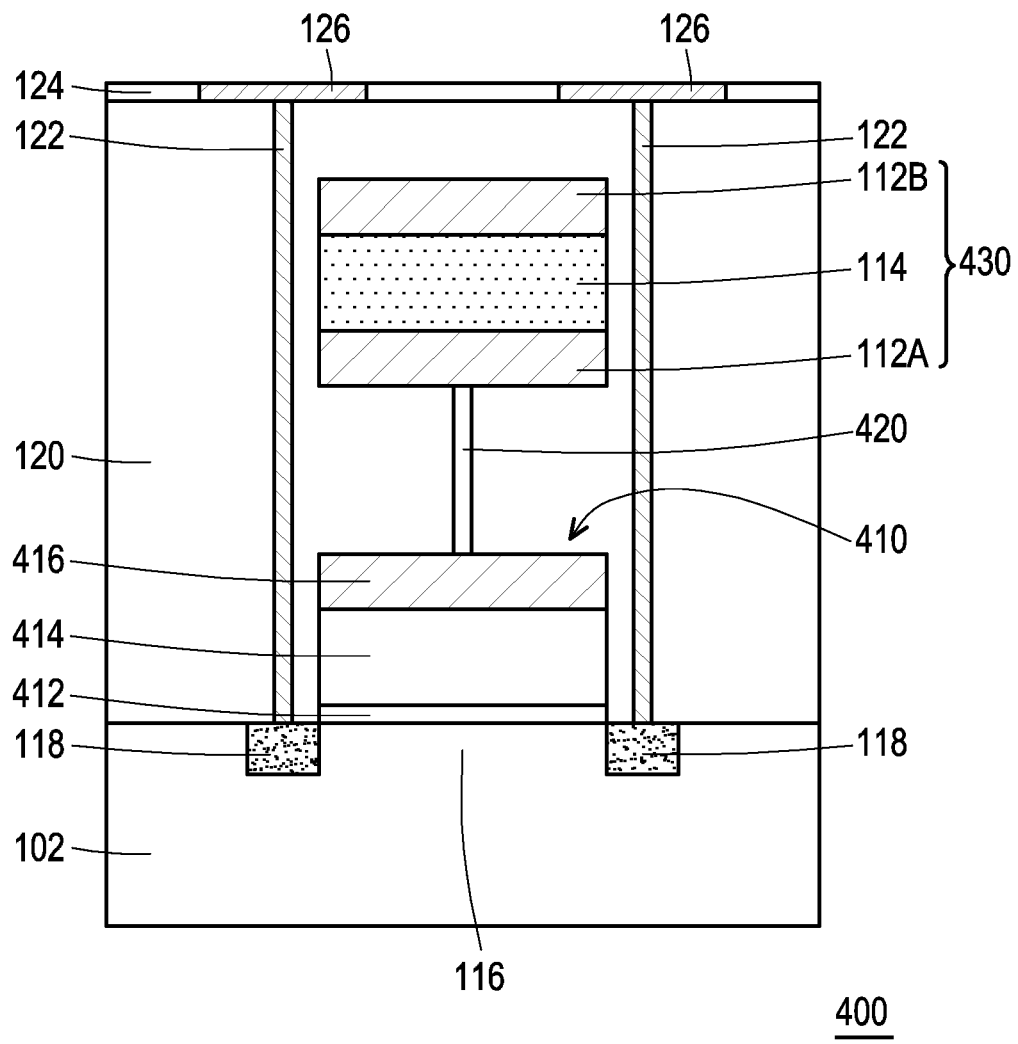
FIG. 4 is a cross-sectional view of a semiconductor device in accordance with some alternative embodiments of the disclosure.

FIG. 4 is a cross-sectional view of a semiconductor device in accordance with some alternative embodiments of the disclosure.

In some embodiments, a semiconductor device 400 includes a transistor 410 in and on a substrate 102 and a ferroelectric tunnel junction (FTJ) structure 430 electrically connected to the transistor 410. In some embodiments, as shown in FIG. 4, the transistor 410 includes an electrode layer 416, a dielectric layer 414, a channel region 116 and source and drain regions 118.

In some embodiments, the source and drain regions 118 are doped regions in the substrate 102. The source and drain regions 118 are doped with the same conductive type dopants. For example, the source and drain regions 118 are doped with n-type dopants such as phosphorus or arsenic and configured for an n-type field-effect transistor, or alternatively, the source and drain regions 118 are doped with p-type dopants such as boron or BF 2 and configured for a p-type field-effect transistor. In some embodiments, the channel region 116 is formed in the substrate 102 between the source and drain regions 118.

In some embodiments, the dielectric layer 414 is disposed on the channel region 116, and the electrode layer 416 is disposed on the dielectric layer 414. In some embodiments, a dielectric layer 412 is further disposed between the dielectric layer 414 and the channel region 116. In some embodiments, the dielectric constant (k-value) of the dielectric layer 412 is lower than dielectric constant (k-value) of the dielectric layer 414. For example, the dielectric layer 414 includes high-k material, and the dielectric layer 412 includes low-k material. The low-k material has a dielectric constant (k-value) lower than about 3.0, about 2.5, or even lower, for example. The low-k material may be silicon oxide, silicon carbide (SiC), silicon carbo-nitride (SiCN), silicon oxy-carbo-nitride (SiOCN), or the like. The high-k material has a dielectric constant greater than about 3.9, greater than about 10 or even greater than about 20, for example. The high-k material may be zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, titanium oxide, a hafnium dioxide-alumina ($HfO_2$—$Al_2O_3$) alloy, the like, or a combination thereof. In some embodiments, the electrode layer 416 may include the same or similar material as the electrode layer 112 in FIG. 1, and may be formed using the same or similar formation method, and thus details are not repeated.

In some embodiments, the FTJ structure 430 includes electrode layers 112A, 112B, and a ferroelectric layer 114. In some embodiments, the electrode layer 112A, the ferroelectric layer 114, and the electrode layer 112B are sequentially formed on the electrode layer 416. In some embodiments, the electrode layer 112A is in direct contact with the ferroelectric layer 114, and the electrode layer 112B is in direct contact with the ferroelectric layer 114. In other words, the ferroelectric layer 114 is sandwiched between the electrode layers 112A, 112B, and opposite surfaces of the ferroelectric layer 114 are both in direct contact with the electrode layers 112A, 112B. The materials, formation methods and the arrangement of the electrode layer 112A, the ferroelectric layer 114, and the electrode layer 112B in FIG. 4 are the same as or similar to those in FIG. 2, thus details are not repeated. In some embodiments, the electrode layer 112A is electrically connected to the electrode layer 416 through a conductive via 420. The conductive via 420 may be disposed at any interconnection tiers. In other words, one or more connection tiers may be interposed between the transistor 410 and the FTJ structure 430, with conductive patterns of the connection tiers establishing electrical connection between the transistor 410 and the FTJ structure 430. In some embodiments, the material of the conductive via 420 includes cobalt, tungsten, copper, titanium, tantalum, aluminum, zirconium, hafnium, a combination thereof, or other suitable metallic materials.

As mentioned above, it is noted that by using proper co-doping in ferroelectric material of the ferroelectric layer 114 (i.e., doping the first dopant and the second dopant), the reduced ferroelectric coercive field and the enhanced polarization are achieved. Thus, the FTJ structure 430 can have a high reliability performance.

Figure 5:
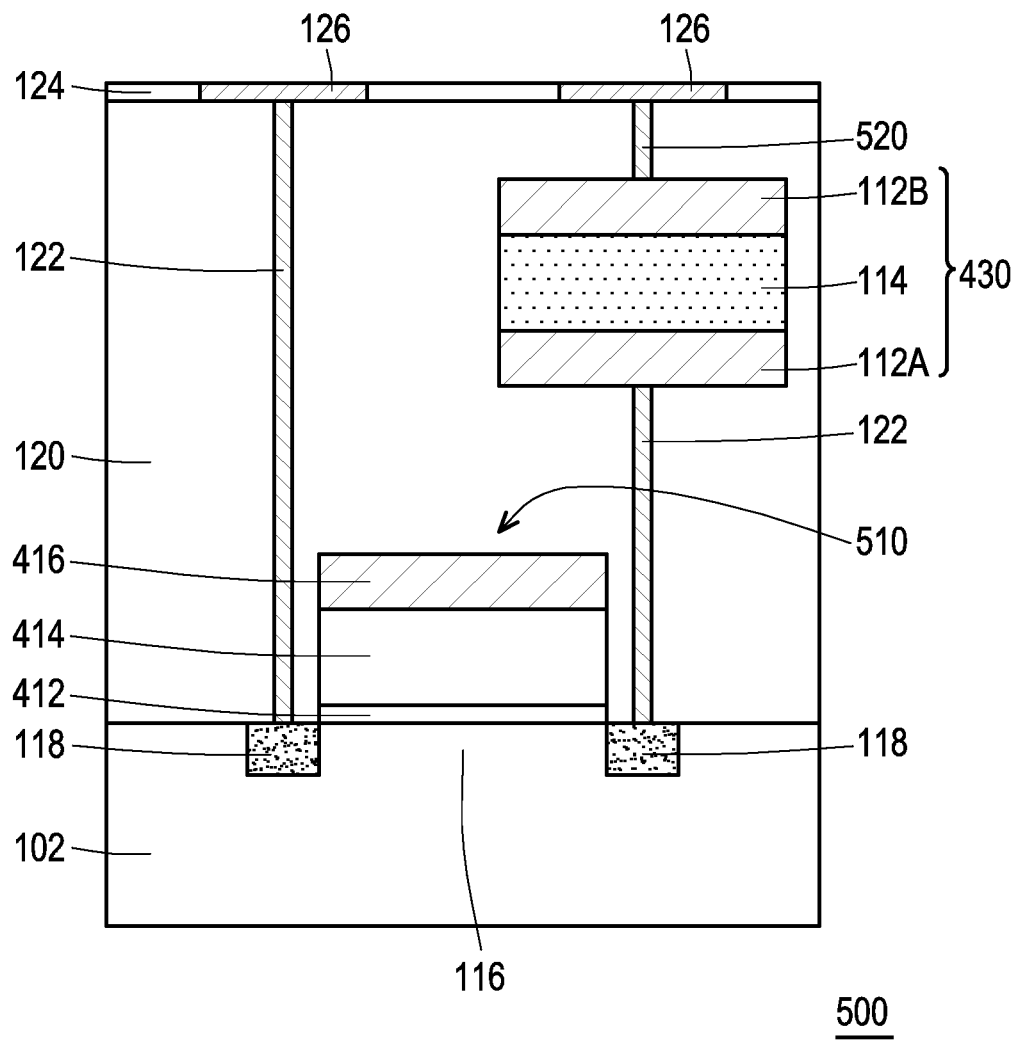
FIG. 5 is a cross-sectional view of a semiconductor device in accordance with some alternative embodiments of the disclosure.

FIG. 5 is a cross-sectional view of a semiconductor device in accordance with some alternative embodiments of the disclosure. Referring to FIG. 5, a semiconductor device 500 in FIG. 5 is similar to the semiconductor device 400 in FIG. 4, so similar elements are denoted by the same reference numeral and the detailed description thereof is omitted herein. Referring to both FIG. 5 and FIG. 4, the main difference between the semiconductor device 500 and the semiconductor device 400 lies in that: in the semiconductor device 500, the electrode layer 112A is electrically connected to the drain region 118 through the drain contact 122, and electrically connected to the conductive line 126 through a conductive via 520; while in the semiconductor device 400, the electrode layer 112A is electrically connected to the electrode layer 416 of the transistor 410 through the conductive via 420. The conductive via 520 may be disposed at any interconnection tiers. In some embodiments, the material of the conductive via 520 includes cobalt, tungsten, copper, titanium, tantalum, aluminum, zirconium, hafnium, a combination thereof, or other suitable metallic materials.

In some embodiments, as shown in FIG. 5, the FTJ structure 430 connected to the drain contact 122 of the transistor 510 formed in and/or on the substrate 102 may be considered a memory cell of the semiconductor device 500. The semiconductor device 500 may be or include a high-density non-volatile memory such as a ferroelectric random-access memory (FeRAM), and the ferroelectric layer 114 is also referred to as a "storage layer." For example, the FTJ structure 430 in FIG. 5 may be connected to the drain region 118 of the transistor 510 receive current flowing through the transistor, which may be configured to act as a driving transistor for the FTJ structure 430. That is to say, the electrode layer 416 of the transistor 510 may be configured as a word line for the memory cells, while the conductive line 126 electrically connected to the drain region 118 may be configured to act as a bit line. In some alternative embodiments, one or more connection tiers may be interposed between the FTJ structure 430 and the conductive line 126, with conductive patterns of the connection tiers establishing electrical connection between the FTJ structure 430 and the conductive line 126. Furthermore, it should be noted that while the FTJ structure 430 may be formed on any metallization levels. In some alternative embodiments, the FTJ structure 430 may be connected through underlying conductive vias to the lower interconnection tiers.

Figure 6:
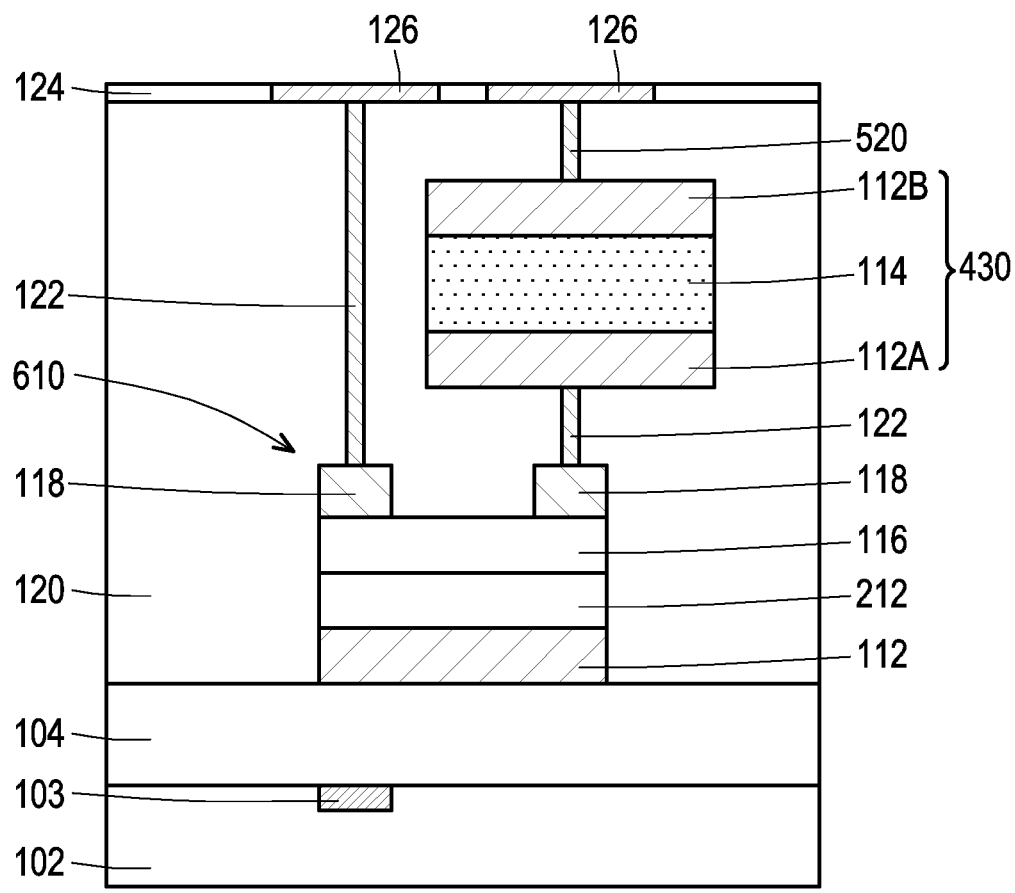
FIG. 6 is a cross-sectional view of a semiconductor device in accordance with some alternative embodiments of the disclosure.

FIG. 6 is a cross-sectional view of a semiconductor device in accordance with some alternative embodiments of the disclosure. Referring to FIG. 6, a semiconductor device 600 in FIG. 6 is similar to the semiconductor device 500 in FIG. 5, so similar elements are denoted by the same reference numeral and the detailed description thereof is omitted herein. Referring to both FIG. 6 and FIG. 5, the main difference between the semiconductor device 600 and the semiconductor device 500 lies in that: the transistor 610 is formed on a dielectric layer 104 on a substrate 102; while the transistor 510 is formed in and/or on the substrate 102.

Referring to FIG. 6, the transistor 610 includes an electrode layer 112, a dielectric layer 212, a channel region 116 and source and drain regions 118, and the FTJ structure 430 includes electrode layers 112A, 112B and a ferroelectric layer 114. In some embodiments, the semiconductor device 600 may be or include a high-density non-volatile memory such as a ferroelectric random-access memory (FeRAM). As shown in FIG. 6, in the transistor 610, the electrode layer 112, the dielectric layer 212, and the channel region 116 are sequentially formed on the dielectric layer 104. That is to say, the dielectric layer 212 is disposed between the electrode layer 112 and the channel region 116. In some embodiments, the dielectric layer 212 is in direct contact with the electrode layer 112, and the dielectric layer 212 is in direct contact with the channel region 116.

In some alternative embodiments, the co-doped ferroelectric layer may be applied in any other suitable memories such as memories with MFM (metal-ferroelectric-metal) structure, MFS (metal-ferroelectric-semiconductor) structure and MFMIS (metal-ferroelectric-metal-insulator-semiconductor) structure. It will be apparent that while the transistor is illustrated with a specific transistor geometry, the disclosure is not limited thereto. For examples, the back-end-of-line transistor may be a planar transistor with back-gate geometry, double-gate geometry, a FinFET transistor, a gate-all-around transistor, or any other gate geometry which may be realized for back-end-of-line transistor.

In accordance with an embodiment, a semiconductor device comprises a first electrode layer; a ferroelectric layer, wherein a material of the ferroelectric layer comprises a ferroelectric material doped with a first dopant and a second dopant different from the first dopant, and the first dopant comprises cerium; and a second electrode layer, wherein the ferroelectric layer is disposed between the first electrode layer and the second electrode layer.

In accordance with an embodiment, a semiconductor device comprises a first electrode layer; a ferroelectric layer, wherein a material of the ferroelectric layer comprises a ferroelectric material doped with a first dopant and a second dopant different from the first dopant, and the second dopant is at least one element selected from a group consisting of Group II, Group III, Group IV and lanthanide; a channel region, wherein the ferroelectric layer is disposed between the first electrode layer and the channel region; and source and drain regions at opposite sides of the first electrode layer.

In accordance with an embodiment, a semiconductor device comprises a ferroelectric tunnel junction (FTJ) structure, and a transistor, electrically connected to the FTJ structure. The FTJ structure comprises a first electrode layer; a ferroelectric layer, wherein a material of the ferroelectric layer comprises a ferroelectric material doped with a first dopant and a second dopant different from the first dopant; and a second electrode layer, wherein the ferroelectric layer is disposed between and in direct contact with the first electrode layer and the second electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a ferroelectric tunnel junction (FTJ) structure, the FTJ structure comprising:
a first electrode layer;
a ferroelectric layer, wherein a material of the ferroelectric layer comprises a ferroelectric material doped with a first dopant and a second dopant different from the first dopant, and the first dopant comprises cerium; and
a second electrode layer, wherein the ferroelectric layer is disposed between the first electrode layer and the second electrode layer; and
a transistor, electrically connected to the FTJ structure, the transistor comprising:
a third electrode layer;
a first dielectric layer under the third electrode layer; and
a second dielectric layer between the first dielectric layer and the third electrode layer, wherein a dielectric constant of the first dielectric layer is smaller than a dielectric constant of the second dielectric layer.

2. The semiconductor device of claim 1, wherein the ferroelectric material of the ferroelectric layer comprises hafnium zirconium oxide (HfZrO), or hafnium oxide ($HfO_2$).

3. The semiconductor device of claim 1, wherein the second dopant is selected from a group consisting of Group II, Group III, Group IV and lanthanide.

4. The semiconductor device of claim 1, wherein the second dopant comprises strontium (Sr), barium (Ba), yttrium (Y), lanthanum (La), gadolinium (Gd), aluminum (Al), silicon (Si), germanium (Ge), or a combination thereof.

5. The semiconductor device of claim 1, wherein the ferroelectric material of the ferroelectric layer is hafnium zirconium oxide (HfZrO) and the second dopant is silicon (Si).

6. The semiconductor device of claim 1, wherein the first electrode layer of the FTJ structure is electrically connected to source and drain regions of the transistor through a contact.

7. A semiconductor device, comprising:
a ferroelectric tunnel junction (FTJ) structure, the FTJ structure comprising:
a first electrode layer; and
a ferroelectric layer, wherein a material of the ferroelectric layer comprises a ferroelectric material doped with a first dopant and a second dopant different from the first dopant, and the second dopant is at least one element selected from a group consisting of Group II, Group III, Group IV and lanthanide; and
a transistor, electrically connected to the FTJ structure, the transistor comprising:
a channel region, wherein the ferroelectric layer is disposed between the first electrode layer and the channel region; and
source and drain regions at opposite sides of the channel region, wherein the FTJ structure further comprises: a second electrode layer between the ferroelectric layer and the channel region, the second electrode layer is electrically connected to the one of the source and drain regions, and the transistor further comprises:
a third electrode layer between the second electrode layer and the channel region;
a first dielectric layer between the third electrode layer and the channel region; and
a second dielectric layer between the first dielectric layer and the channel region, wherein a dielectric constant of the second dielectric layer is smaller than a dielectric constant of the first dielectric layer.

8. The semiconductor device of claim 7, wherein the ferroelectric material of the ferroelectric layer comprises hafnium zirconium oxide (HfZrO), or hafnium oxide ($HfO_2$).

9. The semiconductor device of claim 7, wherein the first dopant is cerium.

10. The semiconductor device of claim 7, wherein the second dopant comprises strontium (Sr), barium (Ba), yttrium (Y), lanthanum (La), gadolinium (Gd), aluminum (Al), silicon (Si), germanium (Ge), or a combination thereof.

11. The semiconductor device of claim 7, wherein the channel region is disposed in a substrate, the source and drain regions are disposed at opposite sides of the channel region in the substrate, and the first electrode layer is disposed on the substrate.

12. The semiconductor device of claim 7, wherein the ferroelectric layer is in direct contact with the second electrode layer and the first electrode layer.

13. The semiconductor device of claim 7, wherein the ferroelectric material is doped with about 4% to about 10% of the first dopant and about 3% to about 6% of the second dopant.

14. The semiconductor device of claim 7, wherein the second electrode layer is electrically connected to one of the source and drain regions through a contact.

15. The semiconductor device of claim 7, wherein the first electrode layer is electrically connected to a conductive line through a conductive via.

16. A semiconductor device, comprising:
a ferroelectric tunnel junction (FTJ) structure, the FTJ structure comprising:
a first electrode layer;
a ferroelectric layer, wherein a material of the ferroelectric layer comprises a ferroelectric material doped with a first dopant and a second dopant different from the first dopant; and
a second electrode layer, wherein the ferroelectric layer is disposed between and in direct contact with the first electrode layer and the second electrode layer; and
a transistor, electrically connected to the FTJ structure, wherein the transistor comprises:
a bottom gate;
a dielectric layer, on the bottom gate;
a channel region, on the dielectric layer; and
source and drain regions, at opposite sides of the bottom gate on the channel region, wherein one of the source and drain regions is electrically connected to one of the first electrode layer and the second electrode layer.

17. The semiconductor device of claim 16, wherein
the first dopant is cerium; and
the second dopant is at least one element selected from a group consisting of Group II, Group III, Group IV and lanthanide.

18. The semiconductor device of claim 16, wherein one of the source and drain regions is electrically connected to one of the first electrode layer and the second electrode layer through a contact.

19. The semiconductor device of claim 16, wherein another one of the first electrode layer and the second electrode layer is electrically connected to a conductive line through a conductive via.

20. The semiconductor device of claim 17, wherein the second dopant comprises strontium (Sr), barium (Ba), yttrium (Y), lanthanum (La), gadolinium (Gd), aluminum (Al), silicon (Si), germanium (Ge), or a combination thereof.

* * * * *